(12) United States Patent
Aspar et al.

(10) Patent No.: US 6,362,077 B1
(45) Date of Patent: Mar. 26, 2002

(54) STRUCTURE COMPRISING A THIN LAYER OF MATERIAL MADE UP OF CONDUCTIVE ZONES AND INSULATING ZONES AND A METHOD OF MANUFACTURING SUCH A STRUCTURE

(75) Inventors: Bernard Aspar, Rives; Michel Bruel, Veurey; Eric Jalaguier, Saint Martin d'Uriage, all of (FR)

(73) Assignee: Commissariat a l'Atomique, Paris (FR)

( * ) Notice: Subject to any disclaimer, the term of this patent is extended or adjusted under 35 U.S.C. 154(b) by 0 days.

(21) Appl. No.: 09/413,483

(22) Filed: Oct. 6, 1999

(30) Foreign Application Priority Data

Oct. 16, 1998 (FR) .............................. 98 13010

(51) Int. Cl.$^7$ ............................... H01L 21/30
(52) U.S. Cl. ................. 438/458; 438/459; 438/520; 438/67
(58) Field of Search ................ 438/455, 458, 438/459, 67, 518, 520

(56) References Cited

U.S. PATENT DOCUMENTS

| 5,256,581 | A | | 10/1993 | Foerstner et al. | |
| 5,374,564 | A | * | 12/1994 | Bruel | 437/24 |
| 5,783,477 | A | | 7/1998 | Kish, Jr. et al. | |
| 5,953,622 | A | * | 9/1999 | Lee et al. | 438/458 |
| 5,993,677 | A | * | 11/1999 | Biasse et al. | 216/36 |
| 6,013,563 | A | * | 1/2000 | Henley et al. | 438/458 |
| 6,020,252 | A | * | 2/2000 | Aspar et al. | 438/458 |

FOREIGN PATENT DOCUMENTS

FR 2 758 907 7/1998

OTHER PUBLICATIONS

Hiroshi Wada, et al.: "Electrical Characteristics Of Directly–Bonded GaAs and InP" Applied Physics Letters, vol. 62, No. 7, Feb. 15, 1993, pp. 738–740, XP000338292.

* cited by examiner

Primary Examiner—Eddie Lee
Assistant Examiner—N. Drew Richards
(74) Attorney, Agent, or Firm—Burns Doane Swecker & Mathis LLP

(57) ABSTRACT

A structure comprising a thin layer (2) that can be integral with a support (3), the thin layer being a layer of a semiconductor material made insulating by ion implantation except for at least one zone that permits a vertical electrical connection through the entire thickness of the thin layer (2). A method of manufacturing such a structure is also disclosed.

25 Claims, 2 Drawing Sheets

STRUCTURE COMPRISING A THIN LAYER OF MATERIAL MADE UP OF CONDUCTIVE ZONES AND INSULATING ZONES AND A METHOD OF MANUFACTURING SUCH A STRUCTURE

TECHNOLOGICAL FIELD

This invention relates to a structure comprising a thin layer of material made up of conductive zones and insulating zones. It also relates to the method of manufacturing such a structure.

STATE OF THE PRIOR TECHNOLOGY

Certain components created on the surface of a substrate require, in order to be used, that an electric current is able to pass through the thickness of the substrate, that is to say, in the vertical direction with respect to the plane of the substrate. One may mention as an example components with vertical operation: electroluminescent diodes, laser diodes (in particular, laser diodes with a vertical cavity), photodetectors, hyperfrequency detectors (in particular, Schottky diodes), power components, solar cells. These components are represented diagrammatically in the form of doped substrates, on which, the active or non-active layers are produced by a specific doping operation. As a general rule, the electrical contacts are made on the front facing surface and at the back of the component or at depth.

Power diodes have two contacts: the anode contact on the front face and the cathode contact on the back face. For more sophisticated power components such as the MOSFETs, the IGBTs and the thyristor structures, there is still one contact on the front face and one contact on the back face with one or more contact points at depth. However, for all these types of components, the electrical current passes between the front and rear faces of the device (see for example the synthesis article entitles "Trends in power semiconductor devices" by B. JAYANT BALIGA, that appeared in IEEE Transactions on Electron Devices, Vol. 43, No. 10, October 1996).

One of the techniques used to provide active layers on the substrate is epitaxial growth. This technique consists of causing a material to grow in an ordered manner from a crystalline substrate whilst controlling its composition. Stacks of epitaxiated semiconductor layers with variable doping levels can be produced in this way. If the epitaxiated semiconductor layers are of the same kind as the crystalline substrate, one refers to deposition by homo-epitaxy. If they are of a different kind, then this is deposition by hetero-epitaxy. This technique permits the production of semiconductor layers of very small thickness (a few tens of Angstrom units), of high purity and with interfaces of excellent quality. However, this technique is very expensive and its low rate of deposition does not enable one to obtain semiconductor layers of thickness greater than a few tens of micrometers in an industrial manner. Furthermore, the epitaxy of the layers can only be created if the substrate has crystal parameters which are close to those of the material to be epitaxiated. In effect, if the crystal parameters are not sufficiently close, the limitation to the matching the lattice parameters greatly reduces the good optical and electronic properties of the structures obtained by hetero-epitaxy. Therefore, this severely limits the number and the diversity of the layers that one is able to grow. In particular, one may mention the difficulty in obtaining components from the III–V family of semiconductors on silicon substrates. For certain components, it is of interest to combine the advantages of different semiconductors. By way of example, one can consider the cases of an active layer of GaAs or an active layer of InP on silicon. This configuration allows one to associate the good electronic properties of the GaAs or InP materials at hyperfrequency with a silicon substrate which has the advantage of being more robust, having less weight and which has better thermal conductivity than GaAs. One may also mention the case of a layer of GaN on a SiC substrate, a structure which offers many advantages for electronic power components.

In another field, solar cells for use in space are of great interest. In effect, energy for satellites is generally supplied by means of panels of solar cells. Among the various possibilities for producing solar cells for use in space, one can mention solar cells made of GaAs. The problem of gallium arsenide is its cost and above all its weight and its fragile nature. In order to resolve this problem, it has been proposed to produce solar cells from thin films of GaAs epitaxiated onto a germanium substrate. A great improvement would consist of providing thin films of GaAs or InP on a silicon substrate. This type of structure would allow one to combine the advantages of GaAs (surface properties to create the component constituting the solar cell) and the advantages of silicon as a support (weight three times less than that of GaAs and much less fragile).

In order to produce these structures made up of a thin film, integral with a substrate of a different material, processes other than hetero-epitaxy can be used. In particular, one may mention the methods of bringing semiconductor substrates into contact by bonding them using molecular adhesion or techniques for transferring thin films. The method disclosed by the document FR-A-2 681 472 offers numerous advantages. It allows one to transfer a thin semiconductor film with a large surface area (of a few thousand Angstrom units with a few micrometers of thickness), from its original substrate to the desired support by a combination of ionic implantation (using light ions), bonding by molecular adhesion and an appropriate heat treatment.

This transfer technique has been the subject of other developments. According to document FR-A-2 748 851, the ion implantation step is carried out with an ion dose which is between a minimum dose and a maximum dose. The minimum dose is that from which sufficient micro-cavities will be created to provide weakening of the substrate along the reference plane. The maximum dose, or critical dose is that above which, during the heat treatment step, there is separation of the substrate. The separation step comprises the application of mechanical forces between the two parts of the substrate.

If the thin film defined in the substrate is sufficiently rigid itself (because of its thickness or because of its mechanical properties), after the transfer annealing, one can obtain a self-supporting film. This is what is disclosed in document FR-A-2 738 671.

Document FR-A-2 767 416 discloses that it is possible to lower the annealing temperature if the thermal budget supplied to the substrate during the various steps of the method is taken into account (ion implantation step, possibly a step of bonding the substrate to a stiffener, possible intermediate treatments, an annealing step to allow separation). By the term thermal budget one understands that for a step where thermal energy is supplied (for example during an annealing step), one must not only consider the temperature but the time-temperature couple supplied to the substrate.

This technique is used now for the industrial manufacture of SOI substrates (see the article by A. J. AUBERTON et al., entitled "SOI materials for ULSI applications" that appeared in Semiconductor International, 1995, Vol. 11, pages 97–104). The feasibility of this technique to III–V semiconductor materials such as GaAs has recently been demonstrated (see the article by E. JALAGUIER et al., entitled "Transfer of 3 in GaAs Film on Silicon Substrate by Proton Implantation Process" published in Electronics Letters, Feb. 19, 1998, Vol. 34, No. 4, pages 408–409). For such a structure, made up of a thin film of GaAs on a silicon support, bonding by using an intermediate layer of silicon oxide has been used. The thin layer of GaAs is therefore electrically insulated from the silicon support. In the case of a solar cell constituted in this way, it is necessary to make an electrical connection on the front face and an electrical connection on the back face, electrical connection with the photo-voltaic thin layer being made through the substrate.

One solution to this problem can be found by choosing a conductive interface between the thin layer and its support, this interface then having also to provide the adhesion of the two parts. Several techniques have been suggested to achieve this. They are given below.

It is possible to provide a direct bond between two semiconductor elements which provide a good electrical contact between these two elements. On this subject one can make reference to the following articles:

"Electrical characteristics of directly-bonded GaAs and InP" by H. WADA et al., that appeared in Appl. Phys. Lett., 62(7), Feb. 15, 1993;

"Low-resistance ohmic conduction across compound semiconductor wafer-bonded interfaces" by F. A. KISH et al., that appeared in Appl. Phys. Lett., 67 (14), Oct. 2, 1995.

The techniques described in these articles are however rather restricting. They frequently demand very good preparation of the surfaces before bonding, often under ultra-vacuum conditions and/or also post-bonding heat treatments at a high temperature (from 600 to 1000° C.) under a reducing atmosphere of hydrogen. These conditions are difficult to implement, in particular when the two semiconductor materials have very different coefficients of thermal expansion (for example, GaAs in relation to Si or SiC). In this case, it is necessary to use low temperature bonding.

Another possibility consists of bringing the two semiconductor elements into contact using previously deposited metal layers. This solution is described in the article "Low Temperature Bonding of Epitaxial Lift-Off Devices with AuSn" by G. RAINER DOHLE et al., that appeared in IEEE Transactions on Components, Packaging and Manufacturing Technology—Part B, Vol. 19, No. 13, August 1996.

In addition, a development of the method described in the document FR-A-2 681 472, mentioned above, has been disclosed in document FR-A-2 758 907. This latter document discloses that, under certain conditions, a masking technique can be used to protect sensitive zones of the future thin layer (for example, constituent zones of MOS transistors) from the passage of ions intended to create the micro-cavities. This implies an absence of micro-cavities in the zones of the bombarded substrate corresponding to the masked areas. Despite all this, cleavage of the substrate can be obtained allowing detachment of a thin film if the width of each masked area does not exceed a limiting value that is specified for the material that constitutes the substrate.

One might then think, given the state of the art described above, that the method of transferring a thin semiconductor layer disclosed by the document FR-A-2 681 472 would allow one to obtain a thin layer of GaAs integral with a silicon support using a conductive interface and that an electrical connection would be possible between the thin layer of GaAs and the silicon support. However, the application of this method of transfer has revealed the following problem. The ion implantation step is generally carried out using light ions such as hydrogen ions. It is found that the passage of hydrogen ions in the GaAs has the effect of considerably modifying the resistivity of the region bombarded by these ions. Hence, a region of GaAs with an initial resistivity of the order of 1 mΩ·cm, sees its resistivity reach a value of the order of $10^5$ Ω·cm, after bombardment with hydrogen ions. This phenomenon is due to the hydrogen which has created centers deep within the GaAs. The result is that a film of GaAs epitaxiated onto a thin layer of GaAs transferred onto a silicon support would be electrically insulated from the support.

To remedy this problem, one can consider using species other than hydrogen to carry out the ion implantation. Hydrogen is however preferred for practical reasons. One may also attempt to restore a certain conductivity to the thin layer of GaAs by means of annealing treatments subsequent to the cleavage. However, these annealing treatments imply a break in the progress of the manufacturing process and are not always desirable.

DESCRIPTION OF THE INVENTION

So as to remedy the disadvantages of the prior art, a structure is proposed that is obtained by the method described in document FR-A-2 681 472, this method being modified so that the conductive or semiconductive layer to be transferred, which is a layer capable of being corrupted by the ion bombardment, is locally protected. This protection allows a transferable layer to be provided that has zones with electrical properties that have not been corrupted.

Hence a subject of the invention is a method of manufacturing a thin layer, the thin layer having to provide at least one vertical electrical connection through its entire thickness, the thin layer being made of a conductive or semiconductive material capable of having its electrical properties disrupted when it is subjected to an ion implantation using specified species, the method comprising the following steps:

masking one face of a substrate comprising said material by masking means that define at least one masked area, the size of which does not exceed a limiting dimension specified for said material, this limiting dimension having to permit splitting of the substrate at the time of the subsequent step of cleavage;

ion implantation of the substrate through its masked face by means of said species, the implantation being capable of creating, within the non-masked volume of the substrate and at a depth close to the mean depth of penetration of the species, a layer of micro-cavities defining said thin layer;

possible removal of said masking means cleavage of the substrate at the level of the layer of micro-cavities in order to obtain said thin layer.

The implanted face of the substrate can be made integral with a support before the cleavage step. It can also be made integral with a support after the cleavage step.

The cleavage step corresponds to a separation of the thin layer and the substrate.

The masking means can comprise deposits of a material capable of preventing penetration of the ions into the substrate during the ion implantation, these deposits being deposited on said face of the substrate. They can also comprise micro-elements deposited on said face of the substrate. These micro-elements can be chosen from among micro-beads and particles.

The masking can be carried out in such a way that the thin layer, retains overall, the electrical properties of the substrate. It can also be created in such a way that the thin layer behaves overall like an insulating layer except for at least one part formed from one zone or several neighboring zones that retain the electrical properties of the substrate. In this case, the part formed by this zone or by these neighboring zones that retain the electrical properties of the substrate can constitute a conductive path or a conductive track.

Integration of the substrate with a support can be achieved by a method chosen between bonding by molecular adhesion and bonding by means of a brazing material, for example a brazing material based on indium.

Before the integration, the method can comprise a step of preparing a conductive interface between said face of the substrate and the support. This step of preparing a conductive interface can comprise the deposition of a metal layer on the face of the substrate and/or on the face of the support, for example, the deposition of a layer of palladium. Associated with this metal layer can be the deposition of conductive metal bonding materials, for example, successive depositions of titanium, nickel and gold. A heat treatment can be carried out in a way to cause the diffusion of the deposited metal layer. The metal material is preferably chosen to react with at least a part of the material of the substrate and/or the support.

This method is advantageously applicable to the manufacture of a structure comprising a thin layer of SiC, GaAs or InP on a support, the ion implantation using hydrogen and/or helium ions. The support can notably be silicon.

Another subject of the invention is a structure comprising a thin layer, the thin layer being a layer of conductive or semiconductive material made insulating by ion implantation except for at least one zone that permits a vertical electrical connection through the entire thickness of the thin layer.

According to a first variant, the thin layer comprises a multitude of zones, these zones being distributed over the whole surface of the thin layer. According to a second variant, the thin layer comprises one zone or a plurality of zones, concentrated in order to constitute at least one conductive path or at least one conductive track.

The thin layer can be integral with a support through the use of an intermediate conductive interface so as to allow electrical connection between these two elements. This conductive interface can be constituted by a metal layer, for example a layer of palladium. Associated with this metal layer can be the deposition of conductive metal bonding materials, for example, successive depositions of titanium, nickel and gold.

The thin layer can also be made integral with a support by using a brazing material, for example a brazing material based on indium.

Advantageously, the semiconductor material of the thin layer is chosen from among SiC, GaAs and InP. The support can notably be silicon.

BRIEF DESCRIPTION OF THE DRAWINGS

The invention will be better understood and other advantages and particular features will become apparent on reading the description which will follow, given by way of a non-limitative example, accompanied by the appended drawings among which.

DETAILED DESCRIPTION OF AN EMBODIMENT OF THE INVENTION

Figure 1:
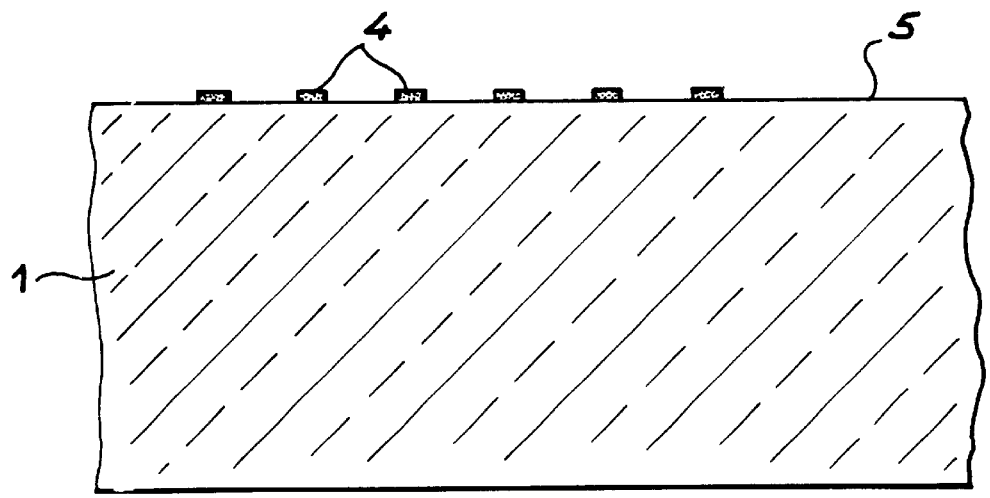
FIGS. 1 to 3 illustrate different steps of the method of manufacture according to this invention.
Figure 2:
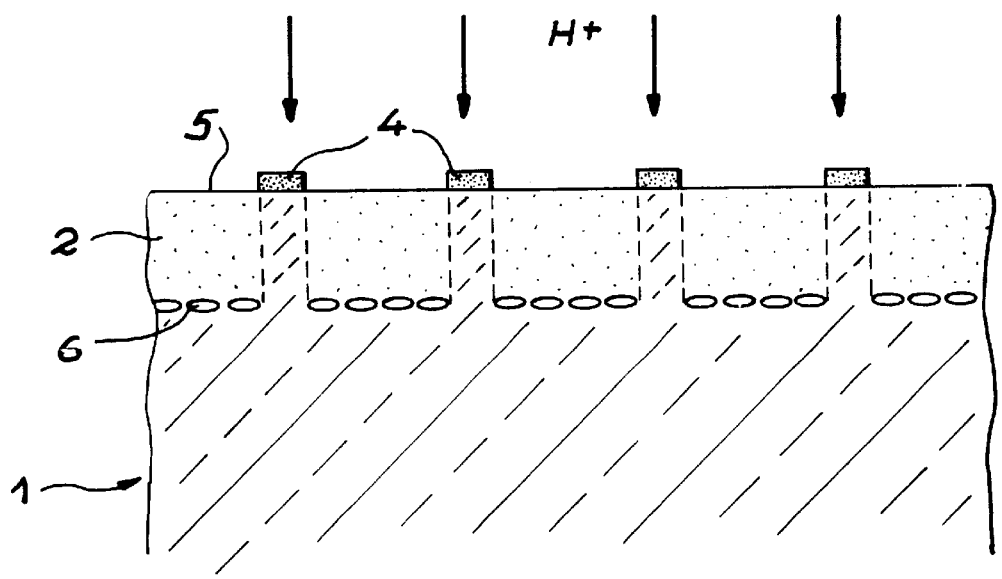
Figure 3:
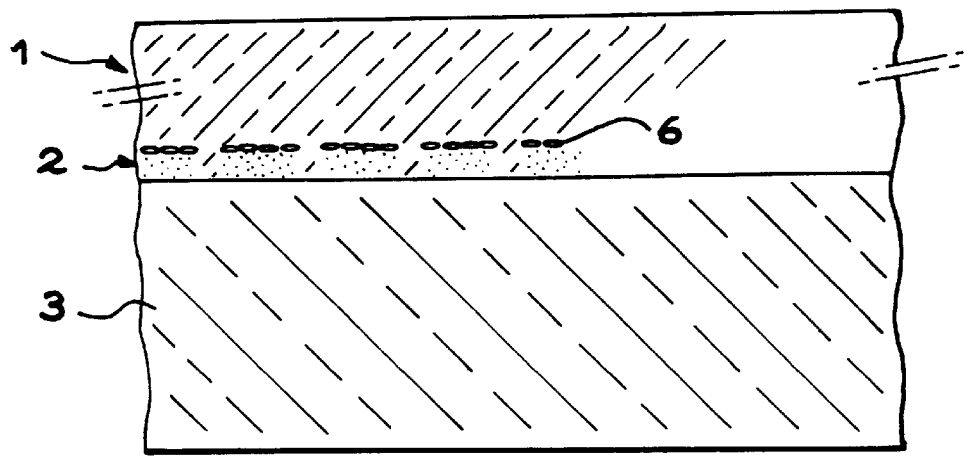
Figure 4:
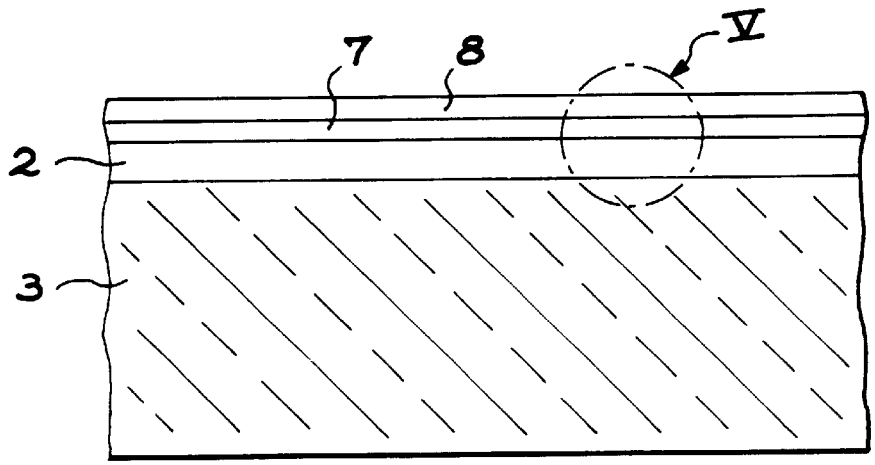
FIG. 4 represents, in cross section, a structure according to this invention, in a particular application.

FIGS. 1 to 3 are cross section views. FIG. 1 shows a semiconductor substrate 1, for example, a substrate made of GaAs. The substrate 1 is intended to provide the thin layer 2 of a structure by integration with a support 3, for example made of silicon (see FIGS. 2 to 5).

Deposits 4 are made onto the upper face 5 of the substrate 1 which are capable of stopping the ions which will subsequently be implanted into the volume of substrate through face 5. The deposits 4 can be resin deposits or deposits of another material (oxide, metal, etc.). The thickness of the deposits is such that ions are prevented from penetrating into the substrate. The size of the deposits is, for example, of the order of from 1 to 2 $\mu$m.

FIG. 2 illustrates the ion implantation step. Hydrogen ions are, for example, used to bombard the substrate 1 through the upper face 5. The energy and the dose of the ions are chosen in such a way as to constitute a layer of micro-cavities 6 at a distance from the face 5 of the substrate corresponding to the desired thickness of the thin layer 2. By their passage, the hydrogen ions make the thin layer 2 insulating. However, the zones of the thin layer 2 masked by the deposits 4 are not affected by the hydrogen ions. These masked zones therefore retain their initial electrical properties of the substrate 1.

By micro-cavity or gaseous micro-bubble, one understands any cavity generated by the implantation of ions of hydrogen gas and/or rare gas in the material. The cavities can be of a very flattened shape, that is to say of small height, for example, a few inter-atomic distances, or of spherical shape or any other shape different from these two preceding shapes. These cavities can contain a free gaseous phase and/or atoms of gas arising from the implanted ions fixed onto atoms of the material forming the walls of the cavities. These cavities are generally called platelets, micro-blisters or even bubbles.

By a layer of micro-cavities, one understands a region containing micro-cavities which can be situated at various depths and which can be adjacent or non-adjacent to one another.

By gaseous species, one understands elements, for example hydrogen or rare gases in their atomic form (for example H) or in their molecular form (for example $H_2$) or in their ionic form (for example $H^+$, $H^{2+}$) or in their isotopic form (for example deuterium) or isotopic and ionic.

In addition, by ion implantation, one understands any type of injection of the species previously defined either alone or in combination, such as ionic bombardment, diffusion, etc.

The layer 6 of micro-cavities obtained in this way is discontinuous. However the discontinuities are of a small size (of the order of 1 to 2 $\mu$m) and are not liable to modify the phenomenon of crack propagation during the subsequent cleavage step.

After the ion implantation step, the deposits 4 made on the face 5 of the substrate 1 are removed. The face 5 of the substrate 1 can be made integral with a receiving surface of a support 3 by molecular adhesion (see FIG. 3). Before this integration step, the faces to be joined are prepared in order to constitute a bonding interface. By way of example, an ohmic contact of very low resistivity (1 Ω·cm) can be obtained if the bonding is carried out using an intermediate layer of palladium deposited on one of the faces or on both the faces to be joined. A similar result can be obtained in the case of a brazing material, such as an indium based brazing material.

Whatever the type of solid material, the heat treatment leads to coalescence of the micro-cavities which leads to a weakening of the structure at the level of the layer of micro-cavities. This weakening permits separation of the material under the effect of internal stresses and/or pressure within the micro-cavities. The separation can be natural or assisted by the application of external stresses.

Hence, the cleavage of the substrate 1 along the layer of micro-cavities 6 is obtained, for example, solely following a suitable heat treatment or by combining a heat treatment and mechanical forces, for example, tensile forces and/or shearing forces and/or bending forces or solely by the use of mechanical stresses. The mechanical forces can be applied perpendicular to the planes of the layers and/or parallel to them. They can be localized to one point or one area or can be applied to different places in a symmetrical or non-symmetrical fashion. The cleavage produces a structure comprising the thin layer 2 integral with the support 3 or a self-supporting thin layer where the thin layer has not been made integral with a support.

Figure 5:
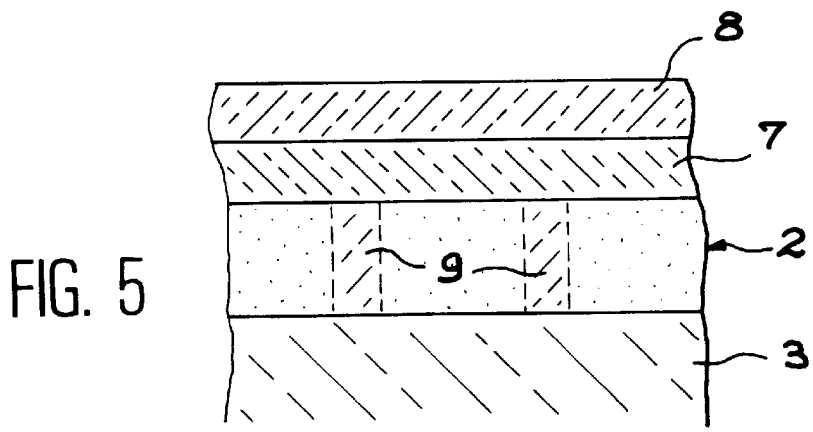
FIG. 5 is an enlarged view of the detail marked V in FIG. 4.

The free face of the thin layer 2 can then be subjected to a mechanical-chemical polishing operation. By epitaxy, layers 7 and 8 of the same semiconductor material as the thin layer 2, can then be successively deposited. A solar cell can be formed in this way by depositing an n doped layer 7 and a p doped layer 8. As FIG. 5 shows, the assembly formed by the layers 7 and 8 is electrically connected to the support 3 through zones 9 which have a side dimension for example of 1 μm. If the zones 9 are constituted by a material with a resistivity of 1 Ω·cm, the resistance of a zone 9, for a thin layer 2 of thickness 100 nm, is 1000Ω. If the zones 9 are each spaced at 10 μm, the total density of these zones is of the order of $10^6/cm^2$, which corresponds to a total apparent resistance of 0.001Ω for a surface area of 1 $cm^2$ of thin layer. If the surface area of a thin layer is for example 70 $cm^2$, its resistance in the vertical direction is then of the order of $10^{-5}$Ω. If such a solar cell receives a power of 1 kW/$m^2$, the recoverable power for an efficiency of 20% is 200 W/$m^2$. For a voltage of 1 Volt, this is equivalent to 200 A/$m^2$ or a current of 1.4 A for a structure of 70 $cm^2$. The resistance of this structure then leads to a voltage drop of $10^{-5}$ V, or an absolutely negligible loss.

Given that the dimensions of the masked areas are small and that the exact positioning of the masking deposits is not important, this masking can be carried out using very simple means, without lithography. These means are for example, masking by micro-beads deposited on the face 5 of the substrate 1 before the ion implantation step. These micro-beads or other particles, can be made of glass, quartz or any other suitable material. Their size varies from a few tenths of a μm to a few μm.

Depending on the application, the thin layer 2 can be heterogeneous, that is to say made up of materials of a different kind stacked one upon the other and/or aligned one by the side of the other.

Furthermore, the thin layer can be self-supporting when its thickness, taking account of the nature of the material used to produce it, gives it sufficient rigidity to induce the separation. This self-supporting thin layer permits applications for example of the anisotropic conductive film type.

In order to obtain a thickness of thin layer that provides sufficient rigidity, one can modify the implantation depth of the species and/or one can form an extra thickness of material, for example, by epitaxy or by hetero-epitaxy at the surface of the thin layer or by deposition.

In addition, according to the invention, the implantation can be the result of different species, implanted simultaneously or successively (cf. FR-A-2 773 261).

What is claimed is:

1. Method of manufacturing a thin layer which operates as at least one vertical electrical connection through its entire thickness, the thin layer comprising a conductive or semi-conductive material whose electrical properties are disruptable by ion implantation using a predetermined implantation species, the method comprising:

masking one face of a substrate comprising said material by masking means that define at least one masked area, the size of said masked area not exceeding a predetermined limiting dimension beyond which crack propagation is modified such that proper cleavage is inhibited;

performing ion implantation of the substrate through said masked face by means of said predetermined implantation species to thereby create, within a non-masked volume of the substrate and at a depth close to a mean depth of penetration of said predetermined implantation species, a layer of micro-cavities demarcating said thin layer;

removing the masking means; and cleaving the substrate at the depth of the layer of micro-cavities in order to obtain said thin layer.

2. Method according to claim 1, characterized in that the implanted face of the substrate is made integral with a support before the cleavage step.

3. Method according to claim 1, characterized in that the thin layer is made integral with a support after the cleavage step.

4. Method according to claim 1, characterized in that the masking means comprise deposits of a material capable of preventing penetration of the ions into the substrate during the ion implantation, these deposits being deposited on said face of the substrate.

5. Method according to claim 1, characterized in that the masking means comprise micro-elements deposited on said face of the substrate.

6. Method according to claim 5, characterized in that said micro-elements are chosen from among micro-beads and particles.

7. Method according to claim 1 characterized in that the masking is carried out in such a way that the thin layer overall preserves the electrical properties of the substrate.

8. Method according to claim 1 characterized in that the masking is carried out in such a way that the thin layer overall behaves like an insulating layer except for at least one part formed from one zone or from several neighboring zones preserving the electrical properties of the substrate.

9. Method according to claim 8, characterized in that the part formed from this zone or from several neighboring zones preserving the electrical properties of the substrate constitutes a conductive path or a conductive track.

10. Method according to claim 2, characterized in that the step of integrating the substrate with the support is carried out by a method chosen between bonding by molecular adhesion and bonding by means of a brazing material.

11. Method according to claim 10, characterized in that said brazing material is based on indium.

12. Method according to claim 2, characterized in that it includes, before the integration step, a step of preparing a conductive interface between said face of the substrate and said support.

13. Method according to claim 12, characterized in that the step of preparing a conductive interface comprises the deposition of a metal layer onto said face of the substrate and/or onto the support.

14. Method according to claim 13, characterized in that the said metal layer is a layer of palladium.

15. Method according to claim 13, characterized in that said interface metal layer is associated with the deposition of conductive metal bonding materials.

16. Method according to claim 15, characterized in that the conductive bonding materials are successive deposits of titanium, nickel and gold.

17. Method according to of claim 13, characterized in that a heat treatment is carried out in a way that causes diffusion of the deposited metal layer.

18. Application of the method according to claim 1 to the manufacture of a structure comprising a thin layer of SiC, GaAs or InP on a support, the ion implantation being carried out using hydrogen and/or helium ions.

19. Application according to claim 18, characterized in that the support is made of silicon.

20. Method according to claim 3, characterized in that the masking means comprise deposits of a material capable of preventing penetration of the ions into the substrate during the ion implantation, these deposits being deposited on said face of the substrate.

21. Method according to claim 6, characterized in that the masking is carried out in such a way that the thin layer overall preserves the electrical properties of the substrate.

22. Method according to claim 6, characterized in that the masking is carried out in such a ways that the thin layer overall behaves like an insulating layer except for at least one part formed from one zone or from several neighboring zones preserving the electrical properties of the substrate.

23. Method according to claim 14, characterized in that said interface metal layer is associated with the deposition of conductive metal bonding materials.

24. Method according to claim 16, characterized in that a heat treatment is carried out in a way that causes diffusion of the deposited metal layer.

25. Application of the method according to claim 17 to the manufacture of a structure comprising a thin layer of SiC, GaAs or InP on a support, the ion implantation being carried out using hydrogen and/or helium ions.

* * * * *